United States Patent [19]
Shin

[11] Patent Number: 6,028,001
[45] Date of Patent: Feb. 22, 2000

[54] METHODS OF FABRICATING CONTACT HOLES FOR INTEGRATED CIRCUIT SUBSTRATES BY ETCHING TO DEFINE A SIDEWALL AND CONCURRENTLY FORMING A POLYMER ON THE SIDEWALL

[75] Inventor: Yoo-Cheol Shin, Kyunggi-do, Rep. of Korea

[73] Assignee: Samsung Electronics Co., Ltd., Rep. of Korea

[21] Appl. No.: 09/273,890

[22] Filed: Mar. 22, 1999

[30] Foreign Application Priority Data

Apr. 2, 1998 [KR] Rep. of Korea ............... 98-11616

[51] Int. Cl.⁷ .................................... H01L 21/4763
[52] U.S. Cl. ................. 438/640; 438/637; 438/668
[58] Field of Search ................... 438/637, 640, 438/666, 668, 947

[56] References Cited

U.S. PATENT DOCUMENTS

| | | | |
|---|---|---|---|
| 5,612,240 | 3/1997 | Chang | 438/947 |
| 5,651,857 | 7/1997 | Cronin et al. | 438/947 |
| 5,670,401 | 9/1997 | Tseng | 438/947 |
| 5,670,427 | 9/1997 | Cho | 438/669 |
| 5,677,242 | 10/1997 | Aisou | 438/640 |
| 5,719,089 | 2/1998 | Cherng et al. | 438/637 |
| 5,817,579 | 10/1998 | Ko et al. | 438/740 |

*Primary Examiner*—Kevin M. Picardat
*Attorney, Agent, or Firm*—Myers Bigel Sibley & Sajovec

[57] ABSTRACT

A contact hole for an integrated circuit substrate is fabricated by forming first and second layers on an integrated circuit substrate and a photoresist pattern on the second layer including a first opening therein. The second layer is etched through the first opening to define a sidewall therein while concurrently forming a polymer on the sidewall, so as to form a second opening in the second layer that is smaller than the first opening. The etching step preferably comprises the step of etching the second layer using a fluorocarbon to define a sidewall therein while concurrently forming a fluorocarbon polymer on the sidewall. The first layer is then etched through the second opening to form the contact hole to the integrated circuit substrate. A conductive layer may be formed in the contact hole to form a conductive contact that electrically contacts the integrated circuit substrate. Accordingly, by concurrently etching the second layer and forming a polymer on the etched sidewall thereof, smaller openings may be formed in the second layer than are formed in the photoresist pattern thereon.

20 Claims, 3 Drawing Sheets

METHODS OF FABRICATING CONTACT HOLES FOR INTEGRATED CIRCUIT SUBSTRATES BY ETCHING TO DEFINE A SIDEWALL AND CONCURRENTLY FORMING A POLYMER ON THE SIDEWALL

FIELD OF THE INVENTION

This invention relates to integrated circuit fabrication methods, and more particularly to methods of fabricating contact holes for integrated circuit substrates.

BACKGROUND OF THE INVENTION

As the integration density of integrated circuit devices continues to increase, it may be increasingly difficult to form small contact holes to an integrated circuit substrate. As shown in FIG. 1a, a contact hole may be formed in an interlayer dielectric layer 4 on an integrated circuit substrate 2 such as a silicon semiconductor substrate, by forming a patterned photoresist layer 6 on the interlayer dielectric layer 4. The photoresist layer is patterned to form an opening 6a therein. The patterned photoresist layer 6 is then used as a mask to etch the interlayer dielectric layer 4 to expose the integrated circuit substrate 2. As shown in FIG. 1b, anisotropic etching is performed to form a contact hole in 4a that can expose the integrated circuit substrate 2. The contact hole may contact a source/drain region of a field effect transistor that is conventionally formed in the integrated circuit substrate 2. The contact hole 4a may then be filled with conductive material to form a contact for an integrated circuit substrate.

Unfortunately, it may be difficult to form contact holes having a diameter that is less than 0.2 $\mu$m with the current state of the art of photolithography. As photolithography continues to improve, it still may be difficult to form increasingly smaller contact holes. In particular, when the interlayer dielectric layer 4 is relatively thick, the upper surface thereof may become larger than the opening 6a, due to erosion of the photoresist layer during etching. Accordingly, there continues to be a need for methods of forming small contact holes to an integrated circuit substrate. Such methods may have particular applicability in forming a storage node of an integrated circuit memory device, wherein higher integration levels make it desirable to form smaller contact holes.

SUMMARY OF THE INVENTION

It is therefore an object of the present invention to provide improved methods of fabricating contact holes to integrated circuit substrates.

It is another object of the present invention to provide methods that can form contact holes that are smaller than contact holes that are formed by a conventional photolithographic process.

These and other objects are provided, according to the present invention, by forming first and second layers on an integrated circuit substrate and a photoresist pattern on the second layer including a first opening therein. The second layer is etched through the first opening to define a sidewall therein while concurrently forming a polymer on the sidewall, so as to form a second opening in the second layer that is smaller than the first opening. The etching step preferably comprises the step of etching the second layer using a fluorocarbon to define a sidewall therein while concurrently forming a fluorocarbon polymer on the sidewall. The first layer is then etched through the second opening to form the contact hole to the integrated circuit substrate. A conductive layer may be formed in the contact hole to form a conductive contact that electrically contacts the integrated circuit substrate. Accordingly, by concurrently etching the second layer and forming a polymer on the etched sidewall thereof, smaller openings may be formed in the second layer than are formed in the photoresist pattern thereon.

In preferred methods of fabricating contact holes to an integrated circuit substrate according to the invention, an interlayer dielectric layer is formed on the integrated circuit substrate. A first layer is formed on the interlayer dielectric layer, opposite the integrated circuit substrate. A second layer is formed on the first layer, opposite the interlayer dielectric layer. A photoresist pattern is formed on the second layer, opposite the first layer. The photoresist pattern includes a first opening therein.

The second layer is etched through the first opening to define a sidewall therein, while concurrently forming a polymer on the sidewall so as to form a second opening in the second layer that is smaller than the first opening. More specifically, the second layer is etched using a fluorocarbon to define a sidewall therein, while concurrently forming a fluorocarbon polymer on the sidewall. The first layer is then obliquely etched through the second opening to form a third opening that is smaller than the second opening. The interlayer dielectric layer is then vertically etched to form the contact hole to the integrated circuit substrate. In preferred methods according to the present invention, the first layer is a conductive layer and the second layer is an insulating layer. More preferably, the first layer comprises polysilicon and the second layer comprises silicon nitride, most preferably silicon oxynitride.

After vertically etching the interlayer dielectric layer, a conductive layer is formed on the first layer and in the third and fourth openings. The conductive layer and the first layer are then etched to form a conductive contact that electrically contacts the integrated circuit substrate. The conductive contact may extend onto the interlayer dielectric layer to define a storage node for an integrated circuit memory device.

Accordingly, a layer is etched to define a sidewall therein while concurrently forming a polymer on the sidewall, so as to form an opening in the layer that is smaller than the sidewall. Etching is preferably performed by etching the layer using a fluorocarbon to define a sidewall therein while concurrently forming a fluorocarbon polymer on the sidewall. After etching, the opening may be used to form a conductive contact. Improved methods of fabricating contact holes and conductive contacts are thereby provided.

DETAILED DESCRIPTION OF PREFERRED EMBODIMENTS

Figure 1A:
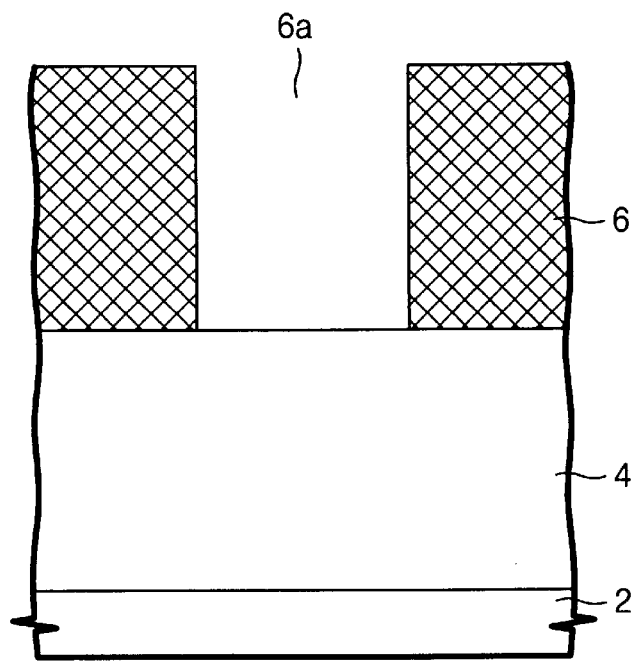
FIGS. 1a–1b are cross-sectional views of conventional integrated circuit contact holes during intermediate fabrication steps.
Figure 1B:
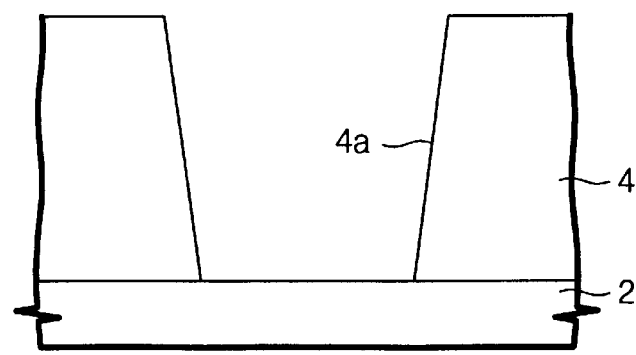

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2A:
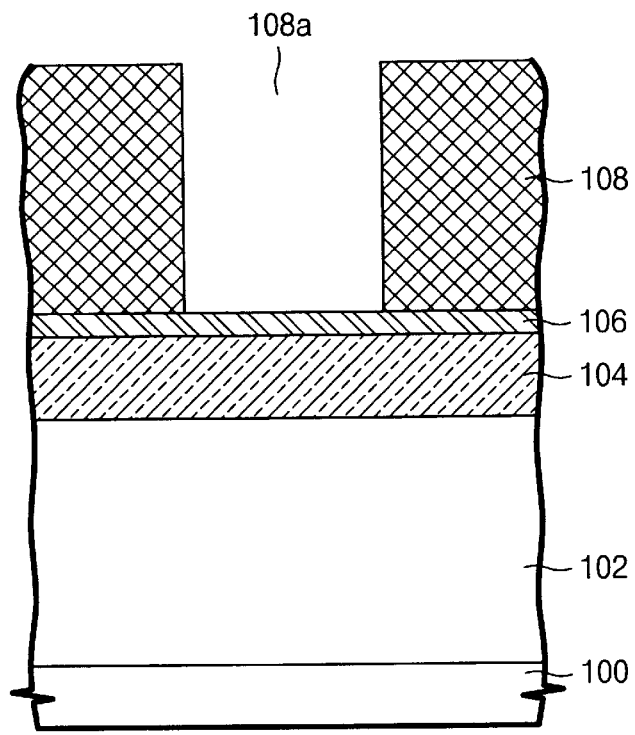
FIGS. 2a–2d are cross-sectional views of contact holes to integrated circuit substrates during intermediate fabrication steps, according to the present invention.

Referring now to FIG. 2a, an interlayer dielectric layer 102 is formed on an integrated circuit substrate 100, such as a silicon semiconductor substrate. The integrated circuit substrate 100 may include field effect transistors therein including spaced apart source/drain regions and an insulated gate therebetween. The interlayer dielectric layer preferably comprises silicon dioxide. A first layer 104 and a second layer 106 are formed on the interlayer dielectric layer. The first layer 104 and the second layer 106 preferably have an etch selectivity with respect to the interlayer dielectric layer 102.

The first layer 104 preferably is a conductive layer and preferably comprises polysilicon. The second layer 106 preferably is an insulating layer, preferably comprises silicon nitride, and more preferably comprises silicon oxynitride. The second layer 106 may serve as an antireflective coating for the first layer 104. In addition, as will be described below, a polymer may form on the second layer 106 during etching thereof, to reduce an opening size. The first layer 104 preferably is between about 100 nm and about 300 nm thick, and the second layer preferably is between about 20 nm and about 100 nm thick.

Still referring to FIG. 2a, a photoresist layer 108 is formed on the second layer 106. The photoresist layer 108 is patterned to define a first opening 108a therein.

Figure 2B:
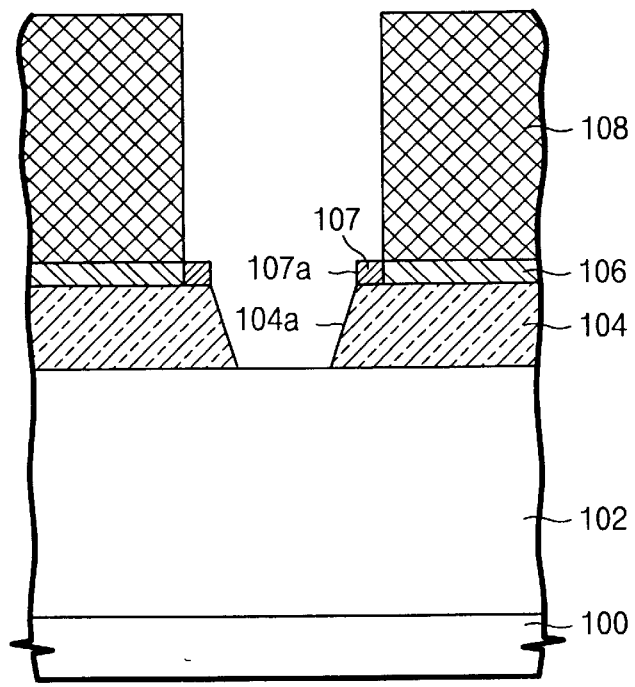

Referring now to FIG. 2b, the second layer 106 is etched using the photoresist layer 108 as a mask. Preferably, etching of the second layer is performed by plasma etching including reactive ion etching using a fluorocarbon to define a sidewall in the second layer 106 while concurrently forming a fluorocarbon polymer 107 on the sidewall. The fluorocarbon polymer 107 forms a second opening 107a in the second layer 106 that is smaller than the first opening 108a. An example of reactive ion etching to define a sidewall and form a fluorocarbon polymer on the sidewall is described in U.S. Pat. No. 5,817,579 to Ko et al. entitled "Two Step Plasma Etch Method for Forming Self Aligned Contact", the disclosure of which is hereby incorporated herein by reference. It will be understood that reactive ion etching is a form of plasma etching which is itself a form of dry etching. The reactive ion etching may use an etching gas including but not limited to $CHF_3$. During the etching step shown in FIG. 2b, the polymer 107 may also be formed on the sidewalls of the photoresist 108 in the opening 108a because the polymer may adhere well to the photoresist 108.

Still referring to FIG. 2b, the polymer 107 and the photoresist layer 108 are used as a mask to obliquely or anisotropically etch the first layer 104. Thus, a third opening 104a may be formed in the first layer that is smaller than the second opening 107a. Oblique etching of the first layer 104 may be performed by changing the composition of the etching gas that is used to etch the second layer and/or controlling the radio frequency power of the reactive ion etcher.

Figure 2C:
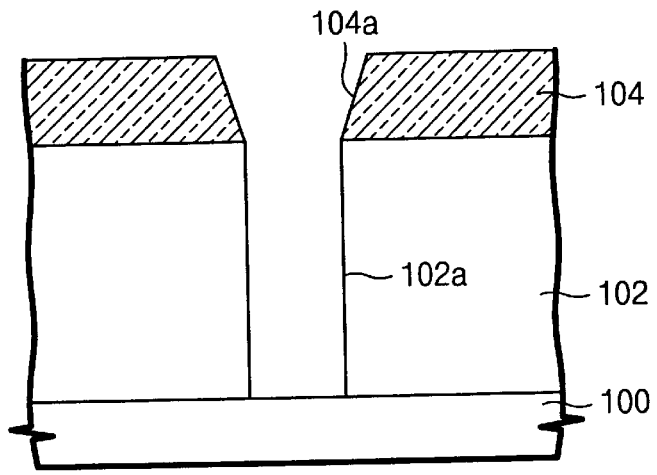

As shown in FIG. 2c, the first layer 104 is used as a mask to vertically etch the interlayer dielectric layer 102 to expose the surface of the integrated circuit substrate 100. More preferably, a source/drain region at the surface of the integrated circuit substrate 100 may be exposed. The interlayer dielectric layer 102 may be vertically etched using the anisotropic etch process described above. Thus, as shown in FIG. 2c, a contact hole 102a is formed to expose the integrated circuit substrate.

Figure 2D:
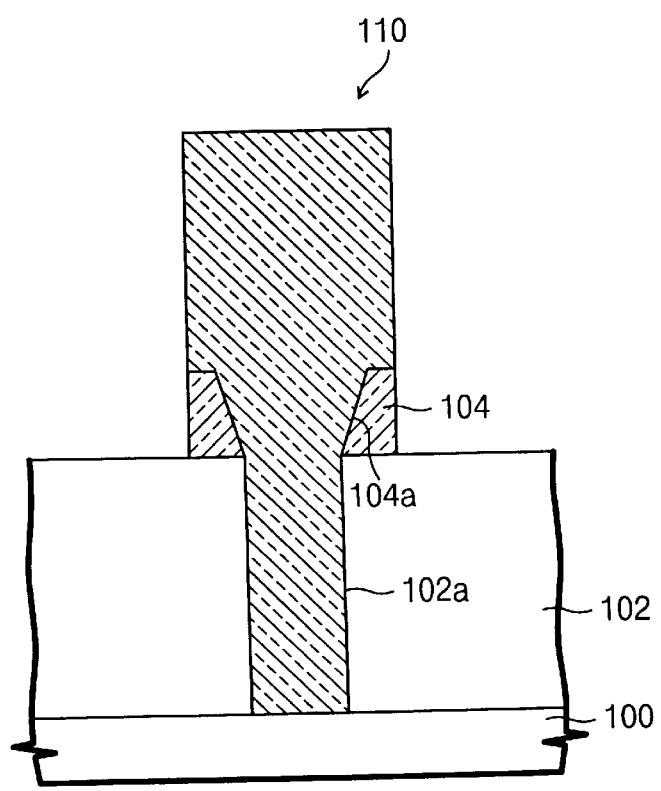

Referring now to FIG. 2d, the photoresist 108, the polymer 107 and the second layer 106 may be removed. A conductive layer such as a polysilicon layer may be formed on the first layer 104 and in the contact hole 102a and in the third opening 104a. The conductive layer and the first layer 104 may be etched to form a storage node 110 for an integrated circuit memory device. As shown in FIG. 2d, the storage node 110 preferably extends onto the interlayer dielectric layer 102. As also shown in FIG. 2d, the portion of the first layer 104 that remains after etching may become part of the storage node. It will also be understood that the storage node 110 may function as a general landing pad for a contact hole.

Accordingly, the formation of a polymer on a sidewall during etching is used to define openings that are smaller than the sidewall. Small contact holes to integrated circuit substrates and small size storage nodes that can have improved overlap margins can thereby be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a contact hole to an integrated circuit substrate comprising the steps of:

forming an interlayer dielectric layer on the integrated circuit substrate;

forming a first layer on the interlayer dielectric layer, opposite the integrated circuit substrate;

forming a second layer on the first layer, opposite the interlayer dielectric layer;

forming a photoresist pattern on the second layer, opposite the first layer, the photoresist pattern including a first opening therein;

etching the second layer through the first opening to define a sidewall therein while concurrently forming a polymer on the sidewall of the second layer during the etching step, so as to form a second opening in the second layer that is smaller than the first opening;

obliquely etching the first layer through the second opening to form a third opening that is smaller than the second opening; and vertically etching the interlayer dielectric layer to form the contact hole to the integrated circuit substrate.

2. A method according to claim 1 wherein the first layer is a first conductive layer and wherein the second layer is an insulating layer.

3. A method according to claim 1 wherein the first layer comprises polysilicon and wherein the second layer comprises silicon nitride.

4. A method according to claim 3 wherein the first layer comprises polysilicon and wherein the second layer comprises silicon oxynitride.

5. A method according to claim 2 wherein the vertically etching step is followed by the steps of:

forming a second conductive layer on the first conductive layer and in the third and fourth openings; and etching the second conductive layer and the first conductive layer to form a conductive contact that electrically contacts the integrated circuit substrate, the conductive contact comprising a portion of both the second conductive layer and the first conductive layer.

6. A method according to claim 1 wherein the first layer is between about 100 nm and about 300 nm thick.

7. A method according to claim 1 wherein the second layer is between about 20 nm and about 100 nm thick.

8. A method according to claim 1 wherein the step of etching the second layer comprises the step of etching the second layer using a fluorocarbon to define a sidewall therein while concurrently forming a fluorocarbon polymer on the sidewall of the second layer during the etching step.

9. A method according to claim 5 wherein the step of etching the second conductive layer comprises the step of etching the second conductive layer and the first conductive layer to form a conductive contact that electrically contacts the integrated circuit substrate and that extends onto the interlayer dielectric layer to define a storage node for an integrated circuit memory device, the storage node comprising a portion of both the second conductive layer and the first conductive layer.

10. A method of fabricating a contact hole to an integrated circuit substrate comprising the steps of:

forming a first layer on the integrated circuit substrate;

forming a second layer on the first layer, opposite the integrated circuit substrate;

forming a photoresist pattern on the second layer, opposite the first layer, the photoresist pattern including a first opening therein;

etching the second layer through the first opening to define a sidewall therein while concurrently forming a polymer on the sidewall of the second layer during the etching step, so as to form a second opening in the second layer that is smaller than the first opening; and etching the first layer through the second opening to form the contact hole to the integrated circuit substrate.

11. A method according to claim 10 wherein the second layer is an insulating layer.

12. A method according to claim 10 wherein the second layer comprises silicon nitride.

13. A method according to claim 10 wherein the second layer comprises silicon oxynitride.

14. A method according to claim 10 wherein the first layer is a first conductive layer and wherein the step of etching the first conductive layer is followed by the steps of:

forming a second conductive layer in the contact hole; and etching the second conductive layer and the first conductive layer to form a conductive contact that electrically contacts the integrated circuit substrate, the conductive contact comprising a portion of the second conductive layer and the first conductive layer.

15. A method according to claim 10 wherein the step of etching the second layer comprises the step of etching the second layer using a fluorocarbon to define a sidewall therein while concurrently forming a fluorocarbon polymer on the sidewall of the second layer during the etching step.

16. A method according to claim 14 wherein the step of etching the second conductive layer comprises the step of etching the second conductive layer and the first conductive layer to form a conductive contact that electrically contacts the integrated circuit substrate, to define a storage node for an integrated circuit memory device, the conductive contact comprising a portion of the second conductive layer and the first conductive layer.

17. A method of fabricating a hole in a layer on an integrated circuit substrate comprising the step of:

etching the layer to define a sidewall therein while concurrently forming a polymer on the sidewall of the layer during the etching step, so as to form an opening in the layer that is smaller than the sidewall.

18. A method according to claim 17 further comprising the step of:

using the opening to form a conductive layer for the integrated circuit substrate.

19. A method according to claim 17 wherein the step of etching the layer comprises the step of etching the layer using a fluorocarbon to define a sidewall therein while concurrently forming a fluorocarbon polymer on the sidewall.

20. A method according to claim 18 wherein the step of using the opening comprises the step of using the opening to form a conductive layer in the hole to form a conductive contact and that extends onto the layer to define a storage node for an integrated circuit memory device.

* * * * *